United States Patent
Goodwin et al.

(10) Patent No.: US 11,091,391 B2
(45) Date of Patent: Aug. 17, 2021

(54) HEAT TREATABLE COATED GLASS PANE

(71) Applicant: Pilkington Group Limited, Lathom (GB)

(72) Inventors: Clare Jane Goodwin, Formby (GB); Kieran James Cheetham, Southport (GB); Angharad Naomi Edwards, Tuscon, AZ (US); John Andrew Ridealgh, Chesire (GB)

(73) Assignee: Pilkington Group Limited, Lathom (GB)

( * ) Notice: Subject to any disclaimer, the term of this patent is extended or adjusted under 35 U.S.C. 154(b) by 0 days.

(21) Appl. No.: 16/012,338

(22) Filed: Jun. 19, 2018

(65) Prior Publication Data
US 2018/0297891 A1   Oct. 18, 2018

Related U.S. Application Data

(63) Continuation of application No. 14/392,371, filed as application No. PCT/GB2014/052473 on Aug. 13, 2014, now Pat. No. 10,000,412.

(30) Foreign Application Priority Data

Aug. 16, 2013 (GB) ..................... 1314699

(51) Int. Cl.
| | |
|---|---|
| *C03C 17/36* | (2006.01) |
| *C23C 16/40* | (2006.01) |
| *C03C 17/00* | (2006.01) |
| *C03C 17/34* | (2006.01) |
| *C03C 17/09* | (2006.01) |
| *C03C 17/245* | (2006.01) |
| *C23C 14/08* | (2006.01) |
| *C23C 14/18* | (2006.01) |
| *C23C 28/00* | (2006.01) |

(52) U.S. Cl.
CPC ........ *C03C 17/3681* (2013.01); *C03C 17/002* (2013.01); *C03C 17/09* (2013.01); *C03C 17/245* (2013.01); *C03C 17/2456* (2013.01); *C03C 17/3411* (2013.01); *C03C 17/36* (2013.01); *C03C 17/3602* (2013.01); *C03C 17/3644* (2013.01); *C23C 14/086* (2013.01); *C23C 14/18* (2013.01); *C23C 16/405* (2013.01); *C23C 28/32* (2013.01); *C03C 2218/156* (2013.01); *C03C 2218/1525* (2013.01)

(58) Field of Classification Search
CPC ... C03C 17/3681; C03C 17/36; C03C 17/245; C03C 17/2456; C03C 17/3644; C03C 17/0002; C03C 17/3411; C03C 17/3602; C03C 2218/156; C03C 2218/1525; C23C 14/086; C23C 14/18; C23C 28/32; C23C 16/405

See application file for complete search history.

(56) References Cited

U.S. PATENT DOCUMENTS

| | | | | |
|---|---|---|---|---|
| 10,000,412 | B2 * | 6/2018 | Goodwin | ............... C03C 17/002 |
| 2003/0027000 | A1 * | 2/2003 | Greenberg | .............. C23C 16/40 |
| | | | | 428/432 |
| 2004/0241457 | A1 * | 12/2004 | Macquart | ............ C03C 17/3618 |
| | | | | 428/432 |
| 2016/0221868 | A1 * | 8/2016 | Goodwin | ............... C03C 17/002 |

FOREIGN PATENT DOCUMENTS

JP        2008153714 A     7/2008

* cited by examiner

*Primary Examiner* — Michael Zhang
(74) *Attorney, Agent, or Firm* — Marshall & Melhorn, LLC

(57) ABSTRACT

A method of manufacturing a coated glass pane comprising the following steps in sequence
  a) providing a glass substrate,
  b) depositing by chemical vapour deposition (CVD) at least one CVD coating on a surface of the glass substrate using titanium tetraisopropoxide (TTIP) as a precursor, and
  c) depositing by physical vapour deposition (PVD) at least one PVD coating on said at least one CVD coating.

14 Claims, No Drawings

HEAT TREATABLE COATED GLASS PANE

BACKGROUND OF THE INVENTION

The invention relates to methods of manufacturing heat treatable coated glass panes with a low-emissivity (low-e) and/or solar control coating. The invention also relates to coated glass panes produced by said methods.

Heat treated glass panes which are toughened to impart safety properties and/or are bent are required for a large number of areas of application, for example for architectural or motor vehicle glazings. It is known that for thermally toughening and/or bending glass panes it is necessary to process the glass panes by a heat treatment at temperatures near or above the softening point of the glass used and then either to toughen them by rapid cooling or to bend them with the aid of bending means. The relevant temperature range for standard float glass of the soda lime silica type is typically about 580-690° C., the glass panes being kept in this temperature range for several minutes before initiating the actual toughening and/or bending process.

"Heat treatment", "heat treated" and "heat treatable" in the following description and in the claims refer to thermal bending and/or toughening processes such as mentioned before and to other thermal processes during which a coated glass pane reaches temperatures in the range of about 580-690° C. for a period of several minutes, e.g., for up to about 10 minutes. A coated glass pane is deemed to be heat treatable if it survives a heat treatment without significant damage, typical damages caused by heat treatments being high haze values, pinholes or spots.

It is worth noting that the parameter "haze" usually referred to when characterising the heat treatability of low-e and/or solar control coatings is often insufficient, as it does not fully reflect all types of defects that may arise during coating, heat treating, processing and/or handling of coated glass panes. Some of the known heat treatable coated glass panes show significant and clearly noticeable modifications of their optical properties and particularly of their reflection colour during a heat treatment. It is also appropriate to maintain the thermal properties of the pane during a heat treatment and this may be characterised in maintaining a similar sheet resistance or in some cases obtaining a lower level of sheet resistance.

Low-e and/or solar control coatings may be deposited by physical vapour deposition (PVD) processes, for example, sputtering. Sputtered low-e and solar control coating stacks are commonly made up of repeat sequences of substrate/base dielectric layer sequence/(Ag/dielectric layer sequence)$^n$ with each of the n dielectric layer sequences not necessarily having the same thicknesses or composition. Sputtered coating stacks are becoming more complicated in their nature due to the need for extra layers in toughenable coatings and the potential move to triple silver solar control stacks. Therefore it is now more common in the industry for n to equal 2 or 3. Since dielectric layers are generally thicker and slower to deposit than metal layers, stacks with a considerable number of such layers require a large number of cathodes in a production coating plant.

Previously, complicated coating stacks have required extensions to coating plants to get the sufficient number of cathodes to make the different materials in sufficient number and order. Extra pumping sections have to be included in the extension to allow the multiple reactive processes to run in sequence. This is done at great expense and with huge disruption, as the coating line needs to be stopped for an extended period for engineering installation. Each new cathode and pumping section also requires the accompanying power supply, vacuum pumps, conveyor sections, services, instrumentation and integration into the control system. It is also likely to cause restructuring of the downstream logistics and possibly even new civil works or building extension. As triple silver (n=3) and even quadruple silver (n=4) stacks become more common, these problems are likely to grow.

There have been attempts to alleviate these problems in the prior art. WO 2012052749A1 describes a process for producing a coated glass which involves depositing a chemical vapour deposited (CVD) coating on at least one surface of a glass substrate to produce a CVD coated glass, and sputter depositing a further coating on the surface of the CVD coated glass, wherein the further coating comprises at least three reflective metal layers.

The CVD undercoating is preferably a layer of silicon oxide overcoated with a layer of titanium oxide. However the examples exhibit high levels of haze upon heat treatment and low levels of visible light transmittance both before and after heat treatment (see page 7, Table 3).

WO 00/32530A1 describes a process for the production of a heat-treatable low emissivity coated glass that comprises the steps of a) depositing an underlayer onto a glass substrate, and b) subsequently depositing a reflective metal layer by a vacuum deposition method, characterised in that the underlayer is deposited by a pyrolytic deposition process. The examples use a silicon oxycarbide underlayer and exhibit visible light transmittance values of from 73.2 to 76.3% before heat treatment (HT) and from 74.9 to 78.2% after HT. The emissivity values of the examples range from 0.060 to 0.076 before HT and from 0.065 to 0.072 after HT.

It would be desirable to provide a method for the manufacture of a coated glazing that alleviates the above-mentioned problems and results in a glazing that exhibits improved optical properties in comparison with prior art processes.

DETAILED DESCRIPTION OF THE INVENTION

According to a first aspect of the present invention there is provided a method of manufacturing a coated glass pane comprising the following steps in sequence
 a) providing a glass substrate,
 b) depositing by chemical vapour deposition (CVD) at least one CVD coating on a surface of the glass substrate using titanium tetraisopropoxide (TTIP) as a precursor, and
 c) depositing by physical vapour deposition (PVD) at least one PVD coating on said at least one CVD coating.

It has surprisingly been found that the use of TTIP as a precursor in the method of the present invention enables the production of coated panes that exhibit improved optical characteristics, both before and after heat treatment, in comparison with the panes obtained by the prior art processes described above. Furthermore, the use of TTIP as a precursor affords a CVD coating that is readily heat treatable, whereas if a layer based on a titanium oxide (TiO$_x$) was deposited by PVD this would result in unacceptable haze upon HT for panes with a layer thicker than around 5 nm. Additionally the present invention can avoid the need to use a layer based on a nitride as the base layer of a lower anti-reflection layer due to sufficient alkali barrier performance. This is advantageous because the deposition of nitride layers requires a nitrogen atmosphere and therefore subsequent deposition of oxide based layers would require a longer coater to ensure gas separation. Moreover, using TTIP as a precursor avoids the disadvantages associated with the deposition of chlorides such as $TiCl_4$ directly on glass, which as well as being difficult can lead to the formation of NaCl and consequently pin holes which can result in poorer barrier performance.

The method of the present invention also has the benefit of allowing the base coating of a multilayer coating stack to be made via CVD rather than PVD which reduces the number of cathodes that are required. Therefore the present invention avoids the need for at least the majority of the cathodes associated with the lower dielectric layers that are employed in low-e and/or solar control coatings. This could free up cathodes to be used for depositing other layers at higher rates or adding extra layers to a stack to increase its complexity.

In the following discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

In the context of the present invention, where a layer is said to be "based on" a particular material or materials, this means that the layer predominantly consists of the corresponding said material or materials, which means typically that it comprises at least about 50 at. % of said material or materials.

Preferably the CVD coating is deposited in the presence of one or more oxygen containing substance. Preferably said one or more oxygen containing substance comprises one or more of an organic oxygen containing compound, water or gaseous oxygen. Preferably the organic oxygen containing compound is an alcohol, or a carbonyl compound such as an ester. Particularly good results have been obtained using esters having an alkyl group with a beta-hydrogen. The alkyl group with a beta-hydrogen will preferably contain two to ten carbon atoms. Such compounds are preferred because larger molecules tend to be less volatile and hence less convenient for use in the deposition of the CVD coating. Preferably the ester is ethyl formate, ethyl acetate, ethyl propionate, isopropyl formate, isopropyl acetate, n-butyl acetate and/or t-butyl acetate.

Preferably the deposition of the CVD coating involves the preparation of a precursor gas mixture which may comprise TTIP and an oxygen containing substance. The precursor gas mixture may further comprise a carrier gas or diluents, for example, nitrogen, air and/or helium.

Preferably the CVD coating has a thickness of at least 5 nm, more preferably at least 10 nm, even more preferably at least 20 nm, most preferably at least 25 nm, but preferably at most 60 nm, more preferably at most 50 nm, even more preferably at most 40 nm, most preferably at most 30 nm.

Preferably the CVD coating comprises at least one layer based on a titanium oxide ($TiO_x$) (doped or undoped). In some embodiments x may be from 1.5 to 2.0. The layer based on a titanium oxide may preferably have a thickness of at least 5 nm, more preferably at least 10 nm, even more preferably at least 20 nm, most preferably at least 25 nm, but preferably at most 60 nm, more preferably at most 50 nm, even more preferably at most 40 nm, most preferably at most 30 nm. This layer serves as a glass side diffusion barrier amongst other uses.

Preferably the at least one layer based on a titanium oxide is deposited using TTIP as a precursor. Preferably at least one layer based on a titanium oxide that is deposited using TTIP as a precursor is located in direct contact with the PVD coating.

The CVD coating may further comprise at least one layer that is not based on a titanium oxide. The CVD coating may further comprise at least one layer based on a silicon oxide (e.g. silicon oxycarbide, silica or silicon oxynitride), tin oxide (doped or undoped), zinc oxide (doped or undoped) or a mixture of any of these materials.

In some preferred embodiments the CVD coating comprises at least one layer, wherein each of the at least one layers is based on a titanium oxide ($TiO_x$).

Preferably a major surface of the CVD coating that is furthest from the glass substrate has an arithmetical mean height of the surface value, Sa, of at most 3 nm, more preferably at most 2 nm, even more preferably at most 1 nm, even more preferably at most 0.7 nm, most preferably at most 0.5 nm. Said major surface of the CVD coating may have an Sa of at least 0.3 nm. Sa gives an indication of the roughness of a surface. A smoother CVD coating may facilitate the deposition of smoother PVD coatings and is believed to be advantageous because the resultant coated panes exhibit less absorption and lower sheet resistance (Rs).

It is particularly beneficial if the CVD coating is deposited during a glass production process. If the glass substrate comprises a float glass substrate, conveniently the CVD coating will be deposited during a float glass deposition process either in the float bath, in the lehr or in the lehr gap. The method of CVD coating is any chemical vapour deposition technique, in particular atmospheric pressure chemical vapour deposition (e.g. online CVD as performed during the float glass deposition process).

The CVD coating may preferably be deposited on the glass substrate when the glass substrate is at a temperature in the range 450° C. to 800° C., more preferably when the glass substrate is at a temperature in the range 550° C. to 700° C. Depositing the CVD coating when the glass substrate is at these preferred temperatures affords greater crystallinity of the coating, which can improve toughenability (resistance to HT).

Preferably the CVD coating is deposited on to a glass ribbon during the float glass production process at substantially atmospheric pressure. Alternatively the CVD coating may be deposited by low-pressure CVD or ultrahigh vacuum CVD. The CVD coating may be deposited using aerosol assisted CVD or direct liquid injection CVD. Furthermore, the CVD coating may be deposited using microwave plasma-assisted CVD, plasma-enhanced CVD, remote plasma-enhanced CVD, atomic layer CVD, combustion CVD (flame pyrolysis), hot wire CVD, metalorganic CVD, rapid thermal CVD, vapour phase epitaxy, or photo-initiated CVD. The glass ribbon will usually be cut into sheets after deposition of the CVD coating (and before deposition of other coatings) for storage or convenient transport from the float glass production facility to a vacuum deposition facility.

Preferably the surface of the glass substrate on which the CVD coating is deposited is the gas side surface. Coated glass manufacturers usually prefer depositing coatings on the gas side surface (as opposed to the tin side surface for float glass) because deposition on the gas side surface can improve the properties of the coating.

Preferably the PVD coating is deposited by sputter deposition. It is particularly preferred if the PVD coating is applied by magnetron cathode sputtering, either in the DC mode, in the pulsed mode, in the medium or radio frequency mode or in any other suitable mode, whereby metallic or semiconducting targets are sputtered reactively or non-reactively in a suitable sputtering atmosphere. Depending on the materials to be sputtered planar or rotating tubular targets may be used. The coating process is preferably carried out by setting up suitable coating conditions such that any oxygen (or nitrogen) deficit of any oxide (or nitride) layer of any anti-reflection layers of the coating is kept low to achieve a high stability of the visible light transmittance and colour of the coated glass panes during a heat treatment. Light transmittance values referred to in the specification are generally specified with reference to a coated glass pane comprising a 4 mm thick standard float glass pane having a light transmittance $T_L$ of 89% without a coating.

Preferably the PVD coating comprises at least one functional layer based on a reflective metal. Preferably said functional layer is a silver-based functional layer.

Preferably the coated pane further comprises a lower anti-reflection layer located between the glass substrate and the at least one functional layer. The functional layer closest to the glass substrate may be deposited directly on the CVD coating i.e. optically the CVD coating would act as the lower anti-reflection layer or first dielectric. Alternatively the PVD coating may preferably further comprise at least one layer based on a dielectric material deposited between the CVD coating and the at least one functional layer.

Preferably the PVD coating further comprises an upper anti-reflection layer located above the functional layer.

In some embodiments the pane comprises more than one functional layer. For example, the pane may comprise two, three or more functional layers. When the pane comprises more than one functional layer, each functional layer may be spaced apart from an adjacent functional layer by a central anti-reflection layer. By providing more than one functional layer, the functional layers may be spaced by intervening dielectric layers(=central anti-reflection layers).

The PVD coating may further comprise at least one layer based on doped or undoped NiCr, Ti, Zn, Zr, Sn, Nb, ITO, $TiO_x$, $Zn_xSn_yO_z$, ZnO, $SnO_x$, $Zn_xAl_xO_z$, $AlN_x$, $SiN_x$, $Si_xAl_yN_z$ or mixtures thereof. Usually each functional layer is deposited between such layers.

The lower anti-reflection layer of a coating comprising at least one functional layer may comprise at least a combination of one or more of the following layers:

a base layer based on a titanium oxide; a silicon oxide (e.g. silicon oxycarbide, silica or silicon oxynitride), tin oxide (doped or undoped), zinc oxide (doped or undoped) or a mixture of any of these materials;

a layer based on a metal oxide, such as an oxide of Zn and Sn and/or an oxide of Sn;

a separation layer based on a metal oxide and/or an (oxi)nitride of Si and/or an (oxi)nitride of Al and/or alloys thereof; and a top layer based on an oxide of Zn.

Preferably the lower anti-reflection layer comprises at least, in sequence from the glass substrate, a base layer based on a titanium oxide; a silicon oxide (e.g. silicon oxycarbide, silica or silicon oxynitride), tin oxide (doped or undoped), zinc oxide (doped or undoped) or a mixture of any of these materials;

a layer based on a metal oxide, such as an oxide of Zn and Sn and/or an oxide of Sn; and a top layer based on an oxide of Zn.

The lower anti-reflection layer may consist of the three layers in sequence as set out above.

In some embodiments the lower anti-reflection layer comprises, in sequence from the glass substrate, a base layer based on a titanium oxide; a silicon oxide (e.g. silicon oxycarbide, silica or silicon oxynitride), tin oxide (doped or undoped), zinc oxide (doped or undoped) or a mixture of any of these materials;

a layer based on a metal oxide, such as an oxide of Zn and Sn and/or an oxide of Sn;

a separation layer based on a metal oxide and/or an (oxi)nitride of Si and/or an (oxi)nitride of Al and/or alloys thereof; and a top layer based on an oxide of Zn.

The layer based on a metal oxide, such as an oxide of Zn and Sn and/or an oxide of Sn of the lower anti-reflection layer serves to improve stability during a heat treatment by providing a dense and thermally stable layer and contributing to reduce the haze after a heat treatment. The layer based on a metal oxide, such as an oxide of Zn and Sn and/or an oxide of Sn of the lower anti-reflection layer may have a thickness of at least 0.5 nm, preferably from 0.5 to 10 nm, more preferably from 0.5 to 9 nm, even more preferably from 1 to 8 nm, even more preferably from 1 to 7 nm, even more preferably from 2 to 6 nm, even more preferably from 3 to 6 nm, most preferably from 3 to 5 nm. An upper thickness limit of about 8 nm is preferred due to optical interference conditions and by a reduction of heat treatability due to the resulting reduction in the thickness of the base layer that would be needed to maintain the optical interference boundary conditions for anti-reflecting the functional layer.

The layer based on a metal oxide, such as an oxide of Zn and Sn and/or an oxide of Sn of the lower anti-reflection layer may be located directly on the base layer.

The layer based on an oxide of Zn and Sn ($ZnSnO_x$) of the lower anti-reflection layer preferably comprises about 10-90 wt. % Zn and 90-10 wt. % Sn, more preferably about 40-60 wt. % Zn and about 40-60 wt. % Sn, preferably about 50 wt. % each of Zn and Sn, in wt. % of its total metal content. In some preferred embodiments the layer based on an oxide of Zn and Sn of the lower anti-reflection layer may comprise at most 18 wt. % Sn, more preferably at most 15 wt. % Sn, even more preferably at most 10 wt. % Sn. The layer based on an oxide of Zn and Sn may be deposited by reactive sputtering of a mixed ZnSn target in the presence of $O_2$.

The separation layer based on a metal oxide and/or an (oxi)nitride of silicon and/or an (oxi)nitride of aluminium and/or alloys thereof may have a thickness of at least 0.5 nm, preferably from 0.5 to 6 nm, more preferably from 0.5 to 5 nm, even more preferably from 0.5 to 4 nm, most preferably from 0.5 to 3 nm. These preferred thicknesses enable further improvement in haze upon heat treatment. The separation layer provides protection during the deposition process and during a subsequent heat treatment. The separation layer is either essentially fully oxidised immediately after its deposition, or it oxidizes to an essentially fully oxidized layer during deposition of a subsequent oxide layer.

The separation layer may be deposited using non-reactive sputtering from a ceramic target based on for instance a slightly substoichiometric titanium oxide, for example a $TiO_{1.98}$ target, as an essentially stoichiometric or as a slightly substoichiometric oxide, by reactive sputtering of a target based on Ti in the presence of $O_2$, or by depositing a thin layer based on Ti which is then oxidised. In the context of the present invention, an "essentially stoichiometric oxide" means an oxide that is at least 95% but at most 105% stoichiometric, whilst a "slightly substoichiometric oxide" means an oxide that is at least 95% but less than 100% stoichiometric.

When the separation layer is based on a metal oxide said separation layer may comprise a layer based on an oxide of Ti, NiCr, InSn, Zr, Al and/or Si.

The term "(oxi)nitride of Si" encompasses both Si nitride ($SiN_x$) and Si oxinitride ($SiO_xN_y$) whilst the term "(oxi)nitride of Al" encompasses both Al nitride ($AlN_x$) and Al oxinitride ($AlO_xN_y$). Si nitride, Si oxinitride, Al nitride and Al oxinitride layers are preferably essentially stoichiometric (e.g. Si nitride=$Si_3N_4$, x=1.33) but may also be substoichiometric or even super-stoichiometric, as long as the heat treatability of the coating is not negatively affected thereby. One preferred composition of such layers is an essentially stoichiometric mixed nitride $Si_{90}Al_{10}N_x$.

Layers of an (oxi)nitride of Si and/or an (oxi)nitride of Al and/or alloys thereof may be reactively sputtered from Si- and/or Al-based targets respectively in a sputtering atmosphere containing nitrogen and argon. An oxygen content of a layer based on an (oxi)nitride of Si and/or an (oxi)nitride of Al and/or alloys thereof may result from residual oxygen in the sputtering atmosphere or from a controlled content of added oxygen in said atmosphere. It is generally preferred if the oxygen content of the Si (oxi)nitride and/or Al (oxi)nitride is significantly lower than its nitrogen content, i.e. if the atomic ratio O/N in the layer is kept significantly below 1. It is most preferred to use Si nitride and/or Al nitride with negligible oxygen content. This feature may be controlled by making sure that the refractive index of the layer does not differ significantly from the refractive index of an oxygen-free Si nitride and/or Al nitride layer.

It is within the scope of the invention to use mixed Si and/or Al targets or to otherwise add metals or semiconductors to the Si and/or Al component of this layer. It is well known and established to mix Al with Si targets, other mixed targets not being excluded. Additional components may be typically present in amounts of up to about 10-15 wt. %. Al is usually present in mixed Si targets in an amount of about 10 wt. %.

In addition to the metal oxide and/or (oxi)nitride of silicon and/or (oxi)nitride of aluminium and/or alloys thereof on which it is based, the separation layer may further include one or more other chemical elements chosen from at least one of the following elements Ti, V, Mn, Co, Cu, Zn, Zr, Hf, Al, Nb, Ni, Cr, Mo, Ta, Si or from an alloy based on at least one of these materials, used for instance as dopants or alloyants.

The top layer based on an oxide of Zn primarily functions as a growth promoting layer for a subsequently deposited functional layer. The top layer based on an oxide of Zn is optionally mixed with metals such as Al or Sn in an amount of up to about 10 wt. % (wt. % referring to the target metal content). A typical content of said metals such as Al or Sn is about 2 wt. %, Al being actually preferred. ZnO and mixed Zn oxides have proven very effective as a growth promoting layer that assists in achieving a low sheet resistance at a given thickness of the subsequently deposited functional layer. It is preferred if the top layer of the lower anti-reflection layer is reactively sputtered from a Zn target in the presence of $O_2$ or if it is deposited by sputtering a ceramic target, e.g. based on ZnO:Al, in an atmosphere containing no or only a low amount, generally no more than about 5 vol. %, of oxygen. The top layer based on an oxide of Zn may have a thickness of at least 2 nm, preferably from 2 to 15 nm, more preferably from 4 to 12 nm, even more preferably from 5 to 10 nm, even more preferably from 5 to 9 nm.

The silver-based functional layer(s) may consist essentially of silver without any additive, as is normally the case in the area of low-e and/or solar control coatings. It is, however, within the scope of the invention to modify the properties of the silver-based functional layer(s) by adding doping agents, alloy additives or the like or even adding very thin metal or metal compound layers, as long as the properties of the silver-based functional layer(s) necessary for its (their) function as highly light-transmitting and low light-absorbent IR-reflective layer(s) are not substantially impaired thereby.

The thickness of a silver-based functional layer is dominated by its technical purpose. For typical low-e and/or solar control purposes the preferred layer thickness for a single silver-based layer is from 5 to 20 nm, more preferably from 5 to 15 nm, even more preferably from 5 to 12 nm, even more preferably from 7 to 11 nm, most preferably from 8 to 10 nm. With such a layer thickness light transmittance values of above 86% and a normal emissivity below 0.05 after a heat treatment can be easily achieved for single silver coatings. If better solar control properties are aimed at the thickness of the silver-based functional layer may be adequately increased or several spaced functional layers may be provided.

When the pane comprises two silver-based functional layers, the silver-based functional layer located furthest from the glass substrate may preferably have a thickness of from 5 to 25 nm, more preferably from 10 to 21 nm, even more preferably from 13 to 19 nm, even more preferably from 14 to 18 nm, most preferably from 15 to 17 nm.

When the pane comprises three silver-based functional layers, the two silver-based functional layers located furthest from the glass substrate may each independently preferably have a thickness of from 5 to 25 nm, more preferably from 10 to 21 nm, even more preferably from 13 to 19 nm, even more preferably from 14 to 18 nm, most preferably from 15 to 17 nm.

Preferably the top layer based on an oxide of Zn in the lower anti-reflection layer is in direct contact with the functional layer.

The central anti-reflection layer(s) may comprise at least a combination of one or more of the following layers: a layer based on an oxide of Zn and/or an oxide of Ti;
a layer based on an oxide of NiCr;
a layer based on a metal oxide, such as an oxide of Zn and Sn and/or an oxide of Sn; and
a layer based on an (oxi)nitride of Si, and/or an (oxi)nitride of Al, and/or alloys thereof, and/or an oxide of Al, Si, Ti, and/or Zr.

In some preferred embodiments each functional layer is spaced apart from an adjacent functional layer by a central anti-reflection layer,
wherein each central anti-reflection layer comprises at least,
in sequence from the functional layer that is located nearest to the glass substrate out of the functional layers that the central anti-reflection layer is located between,
a barrier layer based on an oxide of Zn;
a layer based on a metal oxide, such as an oxide of Zn and Sn and/or an oxide of Sn;
a layer based on an (oxi)nitride of Si, and/or an (oxi)nitride of Al, and/or alloys thereof, and/or an oxide of Al, Si, Ti, and/or Zr, and
a top layer based on an oxide of Zn.

In some other preferred embodiments each functional layer is spaced apart from an adjacent functional layer by a central anti-reflection layer,
wherein each central anti-reflection layer comprises at least, in sequence from the functional layer that is located nearest to the glass substrate out of the functional layers that the central anti-reflection layer is located between, a barrier layer based on an oxide of NiCr;

a barrier layer based on an oxide of Zn;

a layer based on an (oxi)nitride of Si, and/or an (oxi)nitride of Al, and/or alloys thereof, and/or an oxide of Al, Si, Ti, and/or Zr, a layer based on a metal oxide, such as an oxide of Zn and Sn and/or an oxide of Sn; and a top layer based on an oxide of Zn.

The layer based on an oxide of NiCr may preferably have a thickness of at least 0.3 nm, more preferably at least 0.4 nm, even more preferably at least 0.5 nm, most preferably at least 0.6 nm; but preferably at most 5 nm, more preferably at most 2 nm, even more preferably at most 1 nm, most preferably at most 0.9 nm. These preferred thicknesses enable further ease of deposition and improvement in optical characteristics such as haze whilst retaining mechanical durability.

The layer(s) based on an oxide of Zn and/or an oxide of Ti of the central anti-reflection layer may independently preferably have a thickness of at least 1 nm, more preferably at least 2 nm, even more preferably at least 3 nm, most preferably at least 3.5 nm; but preferably at most 10 nm, more preferably at most 7 nm, even more preferably at most 5 nm, most preferably at most 4 nm. These preferred thicknesses enable further ease of deposition and improvement in optical characteristics such as haze whilst retaining mechanical durability.

The layer based on a metal oxide, such as an oxide of Zn and Sn and/or an oxide of Sn of the central anti-reflection layer may preferably have a thickness of at least 5 nm, more preferably at least 10 nm, even more preferably at least 13 nm, most preferably at least 14 nm; but preferably at most 40 nm, more preferably at most 30 nm, even more preferably at most 25 nm, most preferably at most 21 nm.

The layer based on an (oxi)nitride of Si, and/or an (oxi)nitride of Al, and/or alloys thereof, and/or an oxide of Al, Si, Ti, and/or Zr of the central anti-reflection layer may preferably have a thickness of at least 5 nm, more preferably at least 15 nm, even more preferably at least 25 nm, most preferably at least 30 nm; but preferably at most 60 nm, more preferably at most 50 nm, even more preferably at most 45 nm, most preferably at most 40 nm.

The upper anti-reflection layer may comprise at least a combination of one or more of the following layers: a layer based on an oxide of NiCr;

a layer based on an oxide of Zn and/or an oxide of Ti;

a layer based on an (oxi)nitride of Si, and/or an (oxi)nitride of Al, and/or alloys thereof, and/or an oxide of Al, Si, Ti, and/or Zr; and a layer based on a metal oxide, such as an oxide of Zn and Sn and/or an oxide of Sn.

In some preferred embodiments the upper anti-reflection layer comprises at least, in sequence from the functional layer that is located furthest from the glass substrate, a barrier layer based on an oxide of Zn;

a layer based on an (oxi)nitride of Si, and/or an (oxi)nitride of Al, and/or alloys thereof, and/or an oxide of Al, Si, Ti, and/or Zr; and a layer based on a metal oxide, such as an oxide of Zn and Sn and/or an oxide of Sn.

In some other preferred embodiments the upper anti-reflection layer comprises at least, in sequence from the functional layer that is located furthest from the glass substrate, a barrier layer based on an oxide of NiCr;

a barrier layer based on an oxide of Zn;

a layer based on an (oxi)nitride of Si, and/or an (oxi)nitride of Al, and/or alloys thereof, and/or an oxide of Al, Si, Ti, and/or Zr, and a layer based on a metal oxide, such as an oxide of Zn and Sn and/or an oxide of Sn.

The barrier layer based on an oxide of Zn and/or an oxide of Ti of the upper anti-reflection layer may preferably have a thickness of at least 1 nm, more preferably at least 2 nm, even more preferably at least 3 nm, most preferably at least 3.5 nm; but preferably at most 10 nm, more preferably at most 7 nm, even more preferably at most 5 nm, most preferably at most 4 nm. These preferred thicknesses enable further ease of deposition and improvement in optical characteristics such as haze whilst retaining mechanical durability.

It has been found that a superior protection of the functional layer(s) during the deposition process and a high optical stability during a heat treatment can be achieved if the barrier layer comprises a layer of a mixed metal oxide sputtered from a mixed metal oxide target. When the barrier layer is based on an oxide of Zn, said oxide may be a mixed metal oxide such as ZnO:Al. Good results are particularly achieved if a layer based on ZnO:Al is sputtered from a conductive ZnO:Al target. ZnO:Al may be deposited fully oxidized or such that it is slightly suboxidic. Preferably the ZnO:Al barrier layer is essentially stoichiometric. The use of essentially stoichiometric ZnO:Al barrier layers rather than metallic or less than 95% stoichiometric ZnO:Al barrier layers leads to an extremely high optical stability of the coating during a heat treatment and effectively assists in keeping optical modifications during a heat treatment small. Additionally the use of barrier layers based on essentially stoichiometric metal oxides provides benefits in terms of mechanical robustness.

When the barrier layer is based on an oxide of NiCr it is preferably deposited as a substoichiometric oxide. This enables the layer to act as an oxygen scavenger/absorber during a heat treatment.

At least a portion of a barrier layer that is in direct contact with a functional layer is preferably deposited using non-reactive sputtering of an oxidic target to avoid damage to the functional layer.

Preferably the barrier layers are deposited by non-reactive sputtering. Preferably the barrier layers are sputtered from ceramic targets. In the context of the present invention the term "non-reactive sputtering" includes sputtering an oxidic target in a low oxygen atmosphere (no or up to 5 vol. % oxygen) to provide an essentially stoichiometric oxide.

Where a barrier layer is based on $TiO_x$, x may be from 1.5 to 2.0.

The layer based on an (oxi)nitride of Si, and/or an (oxi)nitride of Al, and/or alloys thereof, and/or an oxide of Al, Si, Ti, and/or Zr of the upper anti-reflection layer may preferably have a thickness of at least 2 nm, more preferably at least 5 nm, even more preferably at least 10 nm, most preferably at least 15 nm; but preferably at most 40 nm, more preferably at most 35 nm, even more preferably at most 30 nm, most preferably at most 25 nm. Such thicknesses provide further improvement in terms of mechanical robustness of the coated pane. Said layer based on an (oxi)nitride of Si, and/or an (oxi)nitride of Al, and/or alloys thereof, and/or an oxide of Al, Si, Ti, and/or Zr may preferably be in direct contact with the barrier layer.

The layer based on an (oxi)nitride of Si, and/or an (oxi)nitride of Al, and/or alloys thereof, and/or an oxide of Al, Si, Ti, and/or Zr, which can in some cases make up a major part of the upper anti-reflection layer, provides stability (better protection during heat treatments) and diffusion barrier properties. Said layer is preferably deposited as an Al nitride and/or Si nitride layer by reactive sputtering of a Si, Al or mixed SiAl target, e.g. of a $Si_{90}Al_{10}$ target in a $N_2$ containing atmosphere. The composition of the layer based on an (oxi)nitride of Al and/or an (oxi)nitride of Si may be essentially stoichiometric $Si_{90}Al_{10}N_x$.

The layer based on a metal oxide, such as an oxide of Zn and Sn and/or an oxide of Sn of the upper anti-reflection layer may preferably have a thickness of at least 1 nm, more preferably at least 5 nm, even more preferably at least 7 nm, most preferably at least 9 nm; but preferably at most 20 nm, more preferably at most 15 nm, even more preferably at most 13 nm, most preferably at most 11 nm. Such thicknesses provide further improvement in terms of mechanical robustness of the coated pane. When said layer is an oxide of Zn and Sn it preferably comprises about 10-90 wt. % Zn and 90-10 wt. % Sn, more preferably about 40-60 wt. % Zn and about 40-60 wt. % Sn, preferably about 50 wt. % each of Zn and Sn, in wt. % of its total metal content. In some preferred embodiments said layer based on an oxide of Zn and Sn of the upper anti-reflection layer may comprise at most 18 wt. % Sn, more preferably at most 15 wt. % Sn, even more preferably at most 10 wt. % Sn. Said layer may be deposited by reactive sputtering of a mixed ZnSn target in the presence of $O_2$ and contributes to the anti-reflection properties of the upper anti-reflection layer.

The layer based on an (oxi)nitride of Si, and/or an (oxi)nitride of Al, and/or alloys thereof, and/or an oxide of Al, Si, Ti, and/or Zr of the upper anti-reflection layer may be in direct contact with the layer based on a metal oxide of the upper anti-reflection layer as defined herein without any intervening further dielectric layer.

Preferably the layer based on a metal oxide of the upper anti-reflection layer comprises a layer based on an oxide of Zn and Sn and/or an oxide of Sn.

The upper anti-reflection layer may have a total thickness of from 20 to 60 nm, preferably from 25 to 50 nm, more preferably from 30 to 50 nm, even more preferably from 35 to 45 nm.

A protective layer may be deposited as a top layer (outermost layer) of the upper anti-reflection layer for increased mechanical and/or chemical robustness, e.g. scratch resistance. Said protective layer may comprise a layer based on an oxide of Al, Si, Ti, and/or Zr.

To reduce the light transmittance increase during a heat treatment all individual layers of the upper, central and lower anti-reflection layers are preferably deposited with an essentially stoichiometric composition.

To further optimize the optical properties of the coated pane the upper and/or lower anti-reflection layers may comprise further partial layers consisting of suitable materials generally known for dielectric layers of low-e and/or solar control coatings, in particular chosen from one or more of the oxides of Sn, Ti, Zn, Nb, Ce, Hf, Ta, Zr, Al and/or Si and/or of (oxi)nitrides of Si and/or Al or combinations thereof. When adding such further partial layers it should however be verified that the heat treatability aimed at herein is not impaired thereby.

It will be appreciated that any further partial layer may contain additives that modify its properties and/or facilitate its manufacture, e.g. doping agents or reaction products of reactive sputtering gases. In the case of oxide based layers nitrogen may be added to the sputtering atmosphere leading to the formation of oxinitrides rather than oxides, in the case of nitride based layers oxygen may be added to the sputtering atmosphere, also leading to the formation of oxinitrides rather than nitrides.

Care must be taken by performing a proper material, structure and thickness selection when adding any such further partial layer to the basic layer sequence of the inventive pane that the properties primarily aimed at, e.g. a high thermal stability, are not significantly impaired thereby.

According to a second aspect of the present invention there is provided a coated glass pane manufactured by a method according to the first aspect of the present invention.

According to a third aspect of the present invention there is provided a coated glass pane comprising:
a) a glass substrate,
b) at least one coating on a surface of the glass substrate, wherein said coating comprises at least one crystalline layer based on a titanium oxide, wherein a major surface of said at least one crystalline layer that is furthest from the glass substrate has an arithmetical mean height of the surface value, Sa, of at most 3 nm, and
c) at least one further coating on said at least one coating, wherein said at least one further coating comprises at least one functional layer based on a reflective metal.

It has surprisingly been found that these coated panes exhibit improved optical characteristics, both before and after heat treatment, in comparison with known panes. Additionally the present invention avoids the need to use a layer based on a nitride as the base layer of a lower anti-reflection layer. Also this coated pane has the benefit of allowing the base coating of a multilayer coating stack to be made via CVD rather than PVD which reduces the number of cathodes that are required.

Preferably said at least one coating has been deposited using CVD (i.e. said coating is a CVD coating). Preferably the at least one layer based on a titanium oxide has been deposited using TTIP as a precursor.

Preferably said at least one further coating has been deposited using PVD (i.e. said further coating is a PVD coating).

Preferably the at least one layer based on a titanium oxide is located in direct contact with the at least one further coating.

Preferably said major surface of said at least one crystalline layer that is furthest from the glass substrate has an arithmetical mean height of the surface value, Sa, of at most 2 nm, more preferably at most 1 nm, even more preferably at most 0.7 nm, most preferably at most 0.5 nm. Preferably said major surface of the at least one crystalline layer has an Sa of at least 0.1 nm.

Preferably the coated pane further comprises a lower anti-reflection layer located between the glass substrate and the at least one functional layer. The at least one further coating may preferably further comprise at least one layer based on a dielectric material deposited between the at least one coating on a surface of the glass substrate and the at least one functional layer.

Preferably the at least one further coating further comprises an upper anti-reflection layer located above the functional layer.

According to a fourth aspect of the present invention there is provided a multiple glazing incorporating a coated glass pane in accordance with the present invention. For example the multiple glazing may be laminated glass or insulating glass.

According to a fifth aspect of the present invention there is provided the use of titanium tetraisopropoxide (TTIP) as a precursor in the chemical vapour deposition (CVD) of at least one CVD coating on a surface of a glass substrate prior to the physical vapour deposition (PVD) of at least one PVD coating on said at least one CVD coating.

It will be appreciated that optional features applicable to one aspect of the invention can be used in any combination, and in any number. Moreover, they can also be used with any of the other aspects of the invention in any combination and in any number. This includes, but is not limited to, the dependent claims from any claim being used as dependent claims for any other claim in the claims of this application.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention will now be further described by way of the following specific embodiments, which are given by way of illustration and not of limitation:

For all Examples the coatings were deposited on 4 mm thick standard float glass panes (10 cm×10 cm) with a light transmittance of about 88%. Prior to coating, the glass was washed twice on a Benteler® washing machine.

The layers of comparative example 1 were all deposited using PVD. For example 2 the base layer of $TiO_x$ was deposited using CVD and the other layers were deposited using PVD. For comparative example 3 the $SiO_x$ and $TiO_x$ base layers were deposited using CVD and the other layers were deposited using PVD.

For the CVD coatings the glass was heated on a conveyor furnace to simulate the coating reaction conditions of a float glass process. The furnace utilized in-line rollers to convey a glass substrate through a heating zone prior to the CVD. For comparative example 3 in which the glass substrate had been initially provided with a silica coating, said coating was deposited on the float glass through a known CVD process utilizing a precursor of monosilane in an oxygen enriched atmosphere.

Titanium oxide coatings were deposited by CVD at a substrate temperature of approximately 630° C. To deposit the titanium oxide, a precursor gas mixture was developed comprising TTIP or $TiCl_4$, with ethyl acetate, oxygen, and helium. Helium was included in the precursor mixture as a carrier for the reactants. The precursor mixture was prepared by simultaneously introducing all four gas streams through a manifold system. An in line static mixer was used to ensure a homogeneous precursor mixture.

The temperature of the precursor mixture was kept above 150° C. in order to prevent the adduct reaction of TTIP or $TiCl_4$ and ethyl acetate. The precursor temperature was also kept below the 510° C.-610° C. thermal decomposition temperature range of ethyl acetate in order to prevent the mixture from prereacting. The precursor mixture was introduced into the reactor just above the moving substrate. The temperature at a precursor tower was 120° C. The temperature at the reactor face was 175° C. The higher substrate temperature initiated the thermal decomposition of the ethyl acetate which then resulted in the deposition of the titanium oxide.

The resulting coated glass was allowed to cool in air and the coating was analysed prior to deposition of the PVD coating.

The PVD coatings were deposited using AC and/or DC magnetron sputtering devices, medium-frequency sputtering being applied where appropriate.

All dielectric layers of an oxide of Zn and Sn ($ZnSnO_x$, weight ratio Zn:Sn≈50:50) were reactively sputtered from zinc-tin targets in an $Ar/O_2$ sputter atmosphere.

The ZnO:Al growth promoting top layers of the lower anti-reflection layers were sputtered from Al-doped Zn targets (Al content about 2 wt. %) in an $Ar/O_2$ sputter atmosphere.

The functional layers that in all Examples consisted of essentially pure silver (Ag) were sputtered from silver targets in an Ar sputter atmosphere without any added oxygen and at a partial pressure of residual oxygen below $10^{-5}$ mbar.

The barrier layers of Al-doped zinc oxide (ZnO:Al, ZAO) were sputtered from conductive $ZnO_x$:Al targets in a pure Ar sputter atmosphere without added oxygen.

The layers of mixed silicon aluminium nitride ($Si_{90}Al_{10}N_x$) were reactively sputtered from mixed $Si_{90}Al_{10}$ targets in an $Ar/N_2$ sputter atmosphere containing only residual oxygen.

| Stack (First Layer Deposited On Glass) | % $T_L$ AD (HT) | % A AD (HT) | Haze | Oil Rub Test (AD) | Rs AD (HT) | ε AD (HT) | Sa (nm) |
|---|---|---|---|---|---|---|---|
| Example 1 (Comparative) $SiN_x$ 34 nm/$ZnSnO_x$ 5 nm/$TiO_x$ 2 nm/ZAO 8 nm/Ag 9 nm/ZAO 2 nm/$ZnSnO_x$ 2 nm/ZAO 4 nm/$SiN_x$ 27 nm/$ZnSnO_x$ 9 nm | 88.0 (89.6) | 7.8 (6.0) | 1 | 1 | 7.5 (5.1) | 0.07 (0.05) | 0.2-0.3 ($SiN_x$ base layer) |
| Example 2 $TiO_x$ (deposited using TTIP) 20 nm/$ZnSnO_x$ 5 nm/$TiO_x$ 2 nm/ZAO 8 nm/Ag 9 nm/ZAO 2 nm/$ZnSnO_x$ 2 nm/ZAO 4 nm/$SiN_x$ 27 nm/$ZnSnO_x$ 9 nm | 87.0 (88.2) | 7.3 (6.0) | 2-3 | 0 | 7.5 (7.1) | 0.07 (0.07) | 0.6-0.8 ($TiO_x$ base layer) |
| Example 3 (Comparative) $SiO_x$ 30 nm/$TiO_x$ (deposited using $TiCl_4$) 18 nm/$ZnSnO_x$ 5 nm/$TiO_x$ 2 nm/ZAO 8 nm/Ag 9 nm/ZAO 2 nm/$ZnSnO_x$ 2 nm/ZAO 4 nm/$SiN_x$ 27 nm/$ZnSnO_x$ 9 nm | 81.6 (68.3) | 12.5 (24.7) | 5+ | 1 | 14.6 (81) | 0.16 (Too high to measure) | 2.3-2.4 ($TiO_x$ layer closest to the glass) |

Table 1: Haze score, light transmittance, sheet resistance, emissivity and oil rub test score for a number of comparative coated glass panes and coated glass panes according to the present invention; where: AD=as deposited, HT=after heat treatment, % $T_L$=percentage light transmittance, % A=percentage absorption, Rs=sheet resistance, ε=emissivity, and Sa=arithmetical mean height of the surface value. The methodology used to collect the data in Table 1 is set out below. In Table 1, for each example the layers were deposited onto a glass pane in sequence starting with the first layer shown.

Heat Treatability Tests

After the deposition of the coatings of Examples 1-3, $T_L$, A, Rs and emissivity were measured and the samples were heat treated at about 650° C. for about 5 minutes. Thereafter haze, $T_L$, A, Rs and emissivity were measured. The results are listed in Table 1 above.

The values stated for the % light transmittance (% $T_L$) of the coated glass panes in the Examples 1-3 were derived from measurements according to EN 140.

A visible haze scoring system was applied to the Examples. The quality assessment system described hereinafter was found to be needed to distinguish better the visual quality of coatings under bright light conditions, properties that are not fully reflected by standard haze values measured in accordance with ASTM D 1003-61.

Specular-haze (sometimes called red-haze or white-haze to describe a certain colour cast associated with it) may be considered as a milky or finely dappled spot pattern covering the majority of the coated glass surface. As the name suggests its nature appears to be predominantly, but not completely, specular rather than diffuse. This means the patterns can frequently have a strong angular component to their behaviour i.e. if the illumination and observer's viewing angle is at normal incidence the specular-haze may be strongly apparent whereas if the illumination moves to a very different angle, such as 45°, it may not be.

The evaluation system considers the more macroscopic effect of visible faults in the coating which cause local colour variations where the coating is damaged or imperfect (haze score in Table 1). Macroscopic effects of visible faults in the coating after a heat treatment (all examples exhibit no haze before a heat treatment) were assessed subjectively by viewing samples under bright light. The evaluation is based upon a perfectness scoring (rating) system using scores between 0 (perfect, no faults) through to 3 (some clearly visible faults and/or spots) up to 5 (dense haze, often already visible to the naked eye), rating the visual appearance of the coated glass samples after a heat treatment. Heat treated coated glass panes with any score >3 are considered as having failed the test. Although it is common to get non-zero specular-haze scores this is not a problem at low value as long as the haze is evenly and randomly distributed. If it is concentrated into patterns, or has regions of very high haze, this becomes visually distracting and is unacceptable (i.e. a fail). These localised and/or non-uniform patterns in the haze may take the form of patches, spots or blotches.

The visual evaluation was carried out by using a 2.5 million candela power beam (torch) that is directed at incidence angles between about −90° to about +90° (relative to normal incidence) in two orthogonal planes (i.e. turning the torch first in a horizontal plane and then in a vertical plane) onto a coated glass pane that is arranged in front of a black box. The black box has a sufficiently large size such that several coated glass samples can be evaluated at the same time. The coated glass panes are observed and their visual quality was assessed by varying the angle of incidence as described above, by directing the light beam from the observer through the coated glass panes. The coated glass panes were arranged in front of the black box such that their coating faced the observer.

Mechanical Robustness Test

An oil rub test serves to simulate the influence of cutting oils used for cutting glass panes on the mechanical robustness of a coating. Coated glass panes which do not withstand an oil rub test will be difficult to process and are unsuitable for most practical applications. The coated samples are rubbed using a felt pad with an area of 1.2*1.2 cm² soaked in microscope oil of refractive index of 1.515-1.517. The samples are subjected to 500 cycles with a 900 g load at a speed of 37 cycles per minute. Oil rubbed samples are evaluated using an internal evaluation system on a perfectness scale of 0 (perfect, no damage) to 9 (complete delamination of the coating stack). A score of 1 or less is considered acceptable.

As will be explained hereinafter the coated glass pane of Example 2 not only proved to be heat treatable—as reflected by low haze scores after heat treatment—but also showed better results than the coated pane of Comparative Example 1 in the oil rub test simulating processing and handling of the coated glass panes. The results are shown in Table 1.

Roughness Data—Arithmetical Mean Height of the Surface Value, Sa

The Sa values were obtained in accordance with ISO 25178 using atomic force microscopy.

Summary of Results

Table 1 shows that the pane of Example 2 exhibits high visible light transmittance before and after heat treatment which is similar to that of the all sputtered comparative example 1 and higher (far higher in the case of the heat treated sample) than that of comparative example 3 which used $TiCl_4$ as a precursor for the $TiO_x$ base layer.

Example 2 exhibits low absorption both before and after heat treatment, displaying lower absorption than comparative example 1 before heat treatment and the same absorption after heat treatment. Furthermore the absorption shown by Example 2 is far lower than that of comparative example 3 both before and after heat treatment.

The haze exhibited by the pane of Example 2 after heat treatment is acceptable whereas the pane of comparative example 3 shows unacceptably high levels of haze.

Furthermore, as mentioned above the pane of Example 2 performed better in the oil rub test than comparative example 3 and even comparative example 1.

Table 1 also shows that the pane of Example 2 exhibits sheet resistance and emissivity values, both before and after heat treatment, that are comparable to the pane of comparative example 1 and far better (lower) than the pane of comparative example 3.

The base $TiO_x$ layer of Example 2 exhibits an Sa value that is comparable with that of the sputtered base layer of $SiN_x$ of comparative example 1 and far lower than that of the base $TiO_x$ layer of comparative example 3. As detailed above in page 6, paragraph 3, a smoother CVD coating may facilitate the deposition of smoother PVD coatings and is thought to be advantageous because the resultant coated panes exhibit less absorption and lower sheet resistance (Rs). Additionally, the pane of Example 2 of the present invention exhibits better sheet resistance (lower) and visible light transmittance (higher) both before and after heat treatment, and better haze than any of the three examples of WO 2012052749A1 (see page 7, Table 3).

Also, the pane of Example 2 of the present invention exhibits better light transmittance both before and after heat treatment than any of the four examples of WO 00/32530A1 (see page 9, Table 3). Moreover, the emissivity values of the pane of Example 2 of the present invention are similar to those of the four examples of WO 00/32530A1.

The invention is not restricted to the details of the foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A heat treated coated glass pane manufactured by the method comprising the following steps in sequence:
   a) providing a glass substrate;
   b) depositing by chemical vapour deposition (CVD) one or more layers on a surface of the glass substrate to form a CVD coating, said one or more layers forming the CVD coating comprising at least one layer comprising doped or undoped titanium oxide; and
   wherein the at least one layer comprising titanium oxide is deposited using titanium tetraisopropoxide (TTIP) as a precursor; and
   c) depositing by physical vapour deposition (PVD) at least one PVD layer on said at least one CVD coating to form a PVD coating; and
   d) heat-treating the coated glass pane to a temperature at or above the softening point of the glass substrate, followed by cooling to toughen the coated glass pane; and
   wherein the at least one layer comprising titanium oxide and deposited using titanium tetraisopropoxide as precursor is in direct contact with the at least one PVD layer.

2. A heat treated coated glass pane comprising:
   a) a glass substrate,
   b) at least one coating on a surface of the glass substrate, wherein said coating comprises at least one crystalline layer based on a titanium oxide deposited by chemical vapour deposition (CVD), wherein a major surface of said at least one crystalline layer that is furthest from the glass substrate has an arithmetical mean height of the surface value, Sa, of at most 3 nm, and
   c) at least one further coating deposited by physical vapour deposition (PVD), said at least one further coating located on and in contact with said at least one coating, wherein said at least one further coating comprises at least one functional layer based on a reflective metal,
   wherein the at least one crystalline layer based on a titanium oxide has been deposited using titanium tetraisopropoxide (TTIP) as a precursor.

3. The pane according to claim 2, wherein said major surface of said at least one crystalline layer that is furthest from the glass substrate has an arithmetical mean height of the surface value, Sa, of at most 1 nm.

4. The pane according to claim 2, wherein said major surface of said at least one crystalline layer that is furthest from the glass substrate has an arithmetical mean height of the surface value, Sa, of at most 0.7 nm.

5. The pane according to claim 2, wherein the at least one further coating further comprises at least one layer based on a dielectric material deposited between the at least one coating on a surface of the glass substrate and the at least one functional layer.

6. A multiple glazing unit comprising at least one pane according to claim 2.

7. The pane according to claim 2, wherein the at least one crystalline layer based on a titanium oxide has a thickness of at least 5 nm but at most 60 nm.

8. The pane according to claim 2, wherein the CVD coating further comprises at least one layer based on the group selected from: a silicon oxide, doped or undoped tin oxide or zinc oxide, or a mixture of any of these materials.

9. The pane according to claim 2, wherein said at least one functional layer is a silver-based functional layer.

10. The pane according to claim 2, wherein said at least one further coating comprises a lower anti-reflection layer located between the glass substrate and the at least one functional layer, and an upper anti-reflection layer located above the at least one functional layer.

11. The pane according to claim 2, wherein said at least one further coating comprises at least one layer based on doped or undoped NiCr, Ti, Zn, Zr, Sn, Nb, ITO, TiOx, ZnxSnyOz, ZnO, SnOx, ZnxAlxOz, AlNx, SiNx, SixAlyNz or mixtures thereof.

12. The pane according to claim 10, wherein the lower anti-reflection layer comprises at least a combination of one or more of the following layers:
   a base layer based on titanium oxide, silicon oxide, silicon oxycarbide, silica, silicon oxynitride, doped tin oxide, undoped tin oxide, doped zinc oxide, undoped zinc oxide, or a mixture thereof;
   a layer based on a metal oxide of Zn and Sn and/or an oxide of Sn;
   a separation layer based on a metal oxide and/or an (oxi)nitride of Si and/or an (oxi)nitride of Al and/or alloys thereof; and
   a top layer based on an oxide of Zn.

13. The pane according to claim 10, wherein the upper anti-reflection layer comprises at least a combination of one or more of the following layers:
   a layer based on an oxide of NiCr;
   a layer based on an oxide of Zn and/or an oxide of Ti;
   a layer based on an (oxi)nitride of Si, and/or an (oxi)nitride of Al, and/or alloys thereof, and/or an oxide of Al, Si, Ti, and/or Zr; and
   a layer based on a metal oxide of Zn and Sn and/or an oxide of Sn.

14. The pane according to claim 2 wherein following heat treatment the coated glass comprises a sheet resistance which decreases by 5.3% compared to the sheet resistance of the glass pane prior to heat treatment.

* * * * *